(12) United States Patent
Kim

(10) Patent No.: US 9,305,975 B2
(45) Date of Patent: Apr. 5, 2016

(54) 3 DIMENSIONAL SEMICONDUCTOR DEVICE HAVING A LATERAL CHANNEL

(71) Applicant: SK hynix Inc., Gyeonggi-do (KR)

(72) Inventor: Suk Ki Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/556,817

(22) Filed: Dec. 1, 2014

(65) Prior Publication Data

US 2015/0129828 A1    May 14, 2015

Related U.S. Application Data

(62) Division of application No. 14/057,813, filed on Oct. 18, 2013, now Pat. No. 8,927,328.

(30) Foreign Application Priority Data

Jun. 5, 2013  (KR) .......................... 10-2013-0064578

(51) Int. Cl.

| H01L 29/02 | (2006.01) |
|---|---|
| H01L 27/24 | (2006.01) |
| H01L 29/66 | (2006.01) |
| H01L 21/467 | (2006.01) |
| H01L 45/00 | (2006.01) |
| H01L 29/161 | (2006.01) |
| H01L 29/417 | (2006.01) |

(Continued)

(52) U.S. Cl.
CPC .......... *H01L 27/2463* (2013.01); *H01L 21/467* (2013.01); *H01L 27/2436* (2013.01); *H01L 27/2481* (2013.01); *H01L 29/0847* (2013.01); *H01L 29/161* (2013.01); *H01L 29/41783* (2013.01); *H01L 29/4236* (2013.01); *H01L 29/66621* (2013.01); *H01L 29/66666* (2013.01); *H01L 29/66969* (2013.01); *H01L 29/7838* (2013.01); *H01L 45/126* (2013.01); *H01L 45/1683* (2013.01); *H01L 29/165* (2013.01); *H01L 45/06* (2013.01); *H01L 45/1233* (2013.01); *Y10S 438/90* (2013.01)

(58) Field of Classification Search
CPC ....... H01L 29/78; H01L 21/336; H01L 27/11; H01L 45/00; H01L 29/66; H01L 27/24
USPC ............................ 438/102; 257/2, 4, E45.002
See application file for complete search history.

(56) References Cited

U.S. PATENT DOCUMENTS

| 5,381,025 A * | 1/1995 | Zommer ........................ 257/138 |
| 5,804,848 A * | 9/1998 | Mukai ............................ 257/270 |

(Continued)

*Primary Examiner* — Caleb Henry
(74) *Attorney, Agent, or Firm* — IP & T Group LLP

(57) ABSTRACT

A 3D semiconductor device and a method of manufacturing the same are provided. The method includes forming a first semiconductor layer including a common source node on a semiconductor substrate, forming a transistor region on the first semiconductor layer, wherein the transistor region includes a horizontal channel region substantially parallel to a surface of the semiconductor substrate, and source and drain regions branched from the horizontal channel region to a direction substantially perpendicular to the surface of the semiconductor substrate, processing the first semiconductor layer to locate the common source node corresponding to the source region, forming a gate in a space between the source region and the drain region, forming heating electrodes on the source region and the drain region, and forming resistance variable material layers on the exposed heating electrodes.

11 Claims, 13 Drawing Sheets

(51) Int. Cl.
*H01L 29/423* (2006.01)
*H01L 29/78* (2006.01)
*H01L 29/08* (2006.01)
*H01L 29/165* (2006.01)

(56) References Cited

U.S. PATENT DOCUMENTS

| | | | |
|---|---|---|---|
| 8,169,827 B2* | 5/2012 | Guzzi et al. | 365/185.17 |
| 8,188,537 B2* | 5/2012 | Masuoka et al. | 257/329 |
| 8,343,835 B2* | 1/2013 | Masuoka et al. | 438/268 |
| 8,372,713 B2* | 2/2013 | Masuoka et al. | 438/268 |
| 8,809,835 B2* | 8/2014 | Braithwaite et al. | 257/24 |
| 8,946,670 B1 | 2/2015 | Park | 257/2 |
| 9,024,387 B2* | 5/2015 | Erickson et al. | 257/368 |
| 2004/0057286 A1* | 3/2004 | Chen et al. | 365/185.17 |
| 2005/0145923 A1* | 7/2005 | Chen et al. | 257/315 |
| 2005/0254280 A1* | 11/2005 | Yamauchi | 365/104 |
| 2007/0018256 A1* | 1/2007 | Sumimoto et al. | 257/390 |
| 2007/0158633 A1* | 7/2007 | Lai et al. | 257/4 |
| 2008/0055958 A1* | 3/2008 | Takemura et al. | 365/63 |
| 2008/0135824 A1* | 6/2008 | Lai et al. | 257/2 |
| 2008/0157053 A1* | 7/2008 | Lai et al. | 257/4 |
| 2009/0090963 A1* | 4/2009 | Isobe | 257/326 |
| 2009/0114989 A1* | 5/2009 | Hamamoto | 257/347 |
| 2009/0148981 A1* | 6/2009 | Lai et al. | 438/102 |
| 2009/0159964 A1* | 6/2009 | Lee | 257/329 |
| 2009/0236658 A1* | 9/2009 | Gruening-von Schwerin | 257/331 |
| 2010/0133589 A1* | 6/2010 | Aruga et al. | 257/206 |
| 2010/0187664 A1* | 7/2010 | Polhemus et al. | 257/666 |
| 2010/0200913 A1* | 8/2010 | Masuoka et al. | 257/329 |
| 2010/0207095 A1* | 8/2010 | Lai et al. | 257/4 |
| 2010/0207201 A1* | 8/2010 | Masuoka et al. | 257/329 |
| 2010/0207213 A1* | 8/2010 | Tan et al. | 257/347 |
| 2010/0213525 A1* | 8/2010 | Masuoka et al. | 257/306 |
| 2010/0213539 A1* | 8/2010 | Masuoka et al. | 257/329 |
| 2010/0214839 A1* | 8/2010 | Guzzi et al. | 365/185.17 |
| 2010/0216279 A1* | 8/2010 | Lai et al. | 438/104 |
| 2010/0219483 A1* | 9/2010 | Masuoka et al. | 257/369 |
| 2010/0295123 A1* | 11/2010 | Lung et al. | 257/334 |
| 2011/0215381 A1* | 9/2011 | Masuoka et al. | 257/229 |
| 2011/0272754 A1* | 11/2011 | Tang et al. | 257/314 |
| 2011/0303973 A1* | 12/2011 | Masuoka et al. | 257/329 |
| 2011/0303985 A1* | 12/2011 | Masuoka et al. | 257/369 |
| 2012/0086051 A1* | 4/2012 | Wang et al. | 257/255 |
| 2012/0161094 A1* | 6/2012 | Huo et al. | 257/4 |
| 2012/0196415 A1* | 8/2012 | Masuoka et al. | 438/268 |
| 2012/0270374 A1* | 10/2012 | Masuoka et al. | 438/268 |
| 2013/0040408 A1* | 2/2013 | Nam et al. | 438/3 |
| 2013/0049814 A1* | 2/2013 | De Rooij et al. | 327/108 |
| 2013/0126819 A1* | 5/2013 | Satoh et al. | 257/4 |
| 2013/0140642 A1* | 6/2013 | Aruga et al. | 257/369 |
| 2013/0153998 A1* | 6/2013 | Song et al. | 257/334 |
| 2013/0164910 A1* | 6/2013 | Anderson et al. | 438/430 |
| 2013/0241000 A1* | 9/2013 | Lee et al. | 257/379 |
| 2013/0341724 A1* | 12/2013 | Erickson et al. | 257/368 |
| 2013/0341733 A1* | 12/2013 | Erickson et al. | 257/401 |
| 2014/0030853 A1* | 1/2014 | Desbiens et al. | 438/123 |
| 2014/0050007 A1* | 2/2014 | Xia et al. | 365/104 |
| 2014/0124728 A1* | 5/2014 | Kim et al. | 257/5 |
| 2014/0145137 A1* | 5/2014 | Ju et al. | 257/2 |
| 2014/0247674 A1* | 9/2014 | Karda et al. | 365/189.011 |
| 2014/0308786 A1* | 10/2014 | Lee et al. | 438/238 |
| 2014/0361233 A1* | 12/2014 | Kim | 257/2 |
| 2014/0361240 A1* | 12/2014 | Sim | 257/5 |
| 2015/0028425 A1* | 1/2015 | Kim | 257/379 |
| 2015/0048292 A1* | 2/2015 | Park | 257/2 |
| 2015/0048294 A1* | 2/2015 | Park | 257/2 |
| 2015/0055413 A1* | 2/2015 | Alsmeier | 365/185.08 |
| 2015/0060752 A1* | 3/2015 | Suh | 257/4 |
| 2015/0131360 A1* | 5/2015 | Petti | 365/148 |

* cited by examiner

3 DIMENSIONAL SEMICONDUCTOR DEVICE HAVING A LATERAL CHANNEL

CROSS-REFERENCES TO RELATED APPLICATION

This application is a division of U.S. patent application Ser. No. 14/057,813 filed on Oct. 18, 2013, which claims priority under 35 U.S.C. 119(a) to Korean application No. 10-2013-0064578, filed on Jun. 5, 2013, in the Korean Patent Intellectual Property Office. The disclosure of each of the foregoing application is incorporated by herein by reference in its entirety as set forth in full.

BACKGROUND

1. Technical Field

The inventive concept relates to a semiconductor device and a method of manufacturing the same, and more particularly, to a resistance variable memory device having a three-dimensional (3D) structure and a method of manufacturing the same.

2. Related Art

With the rapid development of mobile and digital information communication and consumer-electronic industry, studies on existing electronic charge controlled-devices may encounter limitations. Thus, new functional memory devices other than the existing electronic charge devices need to be developed. In particular, next-generation memory devices with large capacity, ultra-high speed, and ultra-low power need to be developed.

Currently, resistance variable memory devices using a resistance device as a memory medium have been suggested as the next-generation memory devices. Typical examples of the resistance variable memory devices are phase-change random access memories (PCRAMs), resistance RAMs (ReRAMs), and magentoresistive RAMs (MRAMs).

Each of the resistance variable memory devices may be formed of a switching device and a resistance device and store data "0" or "1" according to a state of the resistance device.

Even in the variable resistive memory devices, the first priority is to improve integration density and to integrate memory cells in a limited and small area as many as possible.

Currently, methods of forming resistance variable memory devices in 3D structures are suggested, and demands on methods of stably stacking a plurality of memory cells with a narrow critical dimension are growing.

As a manufacturing method of a typical 3D structure resistance variable memory device, there is a method of manufacturing a switching device using a vertical pillar. However, the method of manufacturing a switching device using the vertical pillar may have a concern in that a fabrication process of the switching device is complex, and an aspect ratio is increased due to a height of the vertical pillar.

To overcome this concern of the 3D vertical pillar structure, a 3D horizontal channel structure is proposed. The 3D horizontal channel structure is a structure in which an active region having a horizontal channel is supported by a common source region unlike an existing buried type.

However, a manufacturing process of the 3D horizontal channel semiconductor device may be accompanied with a process of aligning a channel of the active region with the common source node, and a process of aligning a gate (a word line) with the channel of the active region. Therefore, a process defect such as misalignment may occur in the manufacturing process.

SUMMARY

According to an exemplary embodiment of the present invention, there is provided a method of manufacturing a semiconductor device. The method may include forming a first semiconductor layer including a common source node on a semiconductor substrate, forming a transistor region on the first semiconductor layer, wherein the transistor region includes a horizontal channel region substantially parallel to a surface of the semiconductor substrate and source and drain regions branched from the horizontal channel region to a direction substantially perpendicular to the surface of the semiconductor substrate, processing the first semiconductor layer to locate the common source node corresponding to the source region, forming a gate in a space between the source region and the drain region, forming heating electrodes on the source region and the drain region, and forming resistance variable material layers on the heating electrodes.

According to another exemplary an embodiment of the present invention, there is provided a method of manufacturing a semiconductor device. The method may include sequentially stacking a first semiconductor layer and a second semiconductor layer having different etch selectivity from that of the first semiconductor layer on a semiconductor substrate, defining a source formation region and a drain formation region by etching a portion of the second semiconductor layer, corresponding to a gate formation region, by a predetermined thickness, forming a gate insulating layer on a surface of the gate formation region and an oxide semiconductor layer in the first semiconductor layer, defining a transistor region by etching the second semiconductor layer and the oxide semiconductor layer in an outer side of the drain formation region, forming a common source node by selectively removing the exposed first semiconductor layer, forming a gate in the gate formation region, forming a source region and a drain region in the source formation region and the drain formation region, respectively, forming heating electrodes on the source region and the drain region, and forming resistance variable material layers on the heating electrodes.

According to still another exemplary embodiment of the present invention, there is provided a semiconductor device. The semiconductor device may include a semiconductor substrate, a common source node formed on the semiconductor substrate, a transistor region including a horizontal channel region formed on the common source node and substantially parallel to a surface of the semiconductor substrate, and source and drain regions branched from the horizontal channel region to a direction substantially perpendicular to the surface of the semiconductor substrate, a gate formed in a space between the source region and the drain region, heating electrodes formed on the source region and the drain region, and resistance variable material layers formed on the heating electrodes. A resistance variable material layer on the drain region is electrically coupled to a heating electrode thereunder, and a resistance variable material layer on the source region is electrically disconnected to a heating electrode thereunder.

For example, the common source node may be formed on a location corresponding to the source region. For example, the source and the drain regions may be arranged to be spaced apart at a certain interval, and the source region is located between a pair of drain regions. Further, a gate insulating layer may be formed between the source region and the gate, between the drain region and the gate, and the horizontal channel region and the gate. The gate may be located in a lower end of the space between the source region and the drain region, and a gate sealing insulating layer is further formed on the gate. For example, the semiconductor device further includes a spacer formed on a sidewall of a resistance variable material layer on the drain region, and a spacer insulating layer located on a sidewall of a resistance variable material layer on the source region, and between the resistance variable material layer on the source region and a heating electrode below the resistance variable material layer.

These and other features, aspects, and embodiments are described below in the section entitled "DETAILED DESCRIPTION".

BRIEF DESCRIPTION OF THE DRAWINGS

The above and other aspects, features and other advantages of the subject matter of the present disclosure will be more clearly understood from the following detailed description taken in conjunction with the accompanying drawings, in which:

FIGS. 1A to 13 are plan views illustrating a method of manufacturing a 3D semiconductor device according to an embodiment of the inventive concept;

FIG. 3 is a perspective view illustrating the semiconductor device manufactured according to an embodiment of the inventive concept;

FIG. 4 is a block diagram illustrating a microprocessor according to an embodiment of the inventive concept;

FIG. 5 is a block diagram illustrating a processor according to an embodiment of the inventive concept; and FIG. 6 is a block diagram illustrating a system according to an embodiment of the inventive concept.

DETAILED DESCRIPTION

Figure 1A:
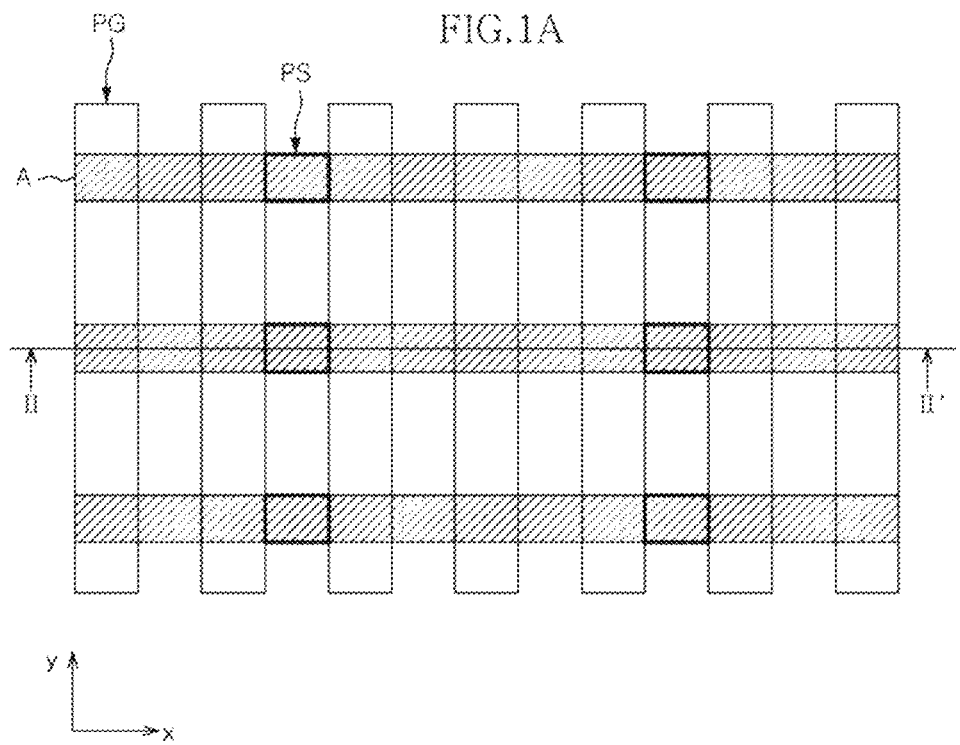

Hereinafter, exemplary embodiments will be described in greater detail with reference to the accompanying drawings.

Exemplary embodiments are described herein with reference to cross-sectional illustrations that are schematic illustrations of exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but may be to include deviations in shapes that result, for example, from manufacturing. In the drawings, lengths and sizes of layers and regions may be exaggerated for clarity. Like reference numerals in the drawings denote like elements. It is also understood that when a layer is referred to as being "on" another layer or substrate, it can be directly on the other or substrate, or intervening layers may also be present. It is also noted that in this specification, "connected/coupled" refers to one component not only directly coupling another component but also indirectly coupling another component through an intermediate component. In addition, a singular form may include a plural form as long as it is not specifically mentioned in a sentence.

In the embodiment, a resistance variable memory device among semiconductor devices will be described as an example.

Figure 1B:
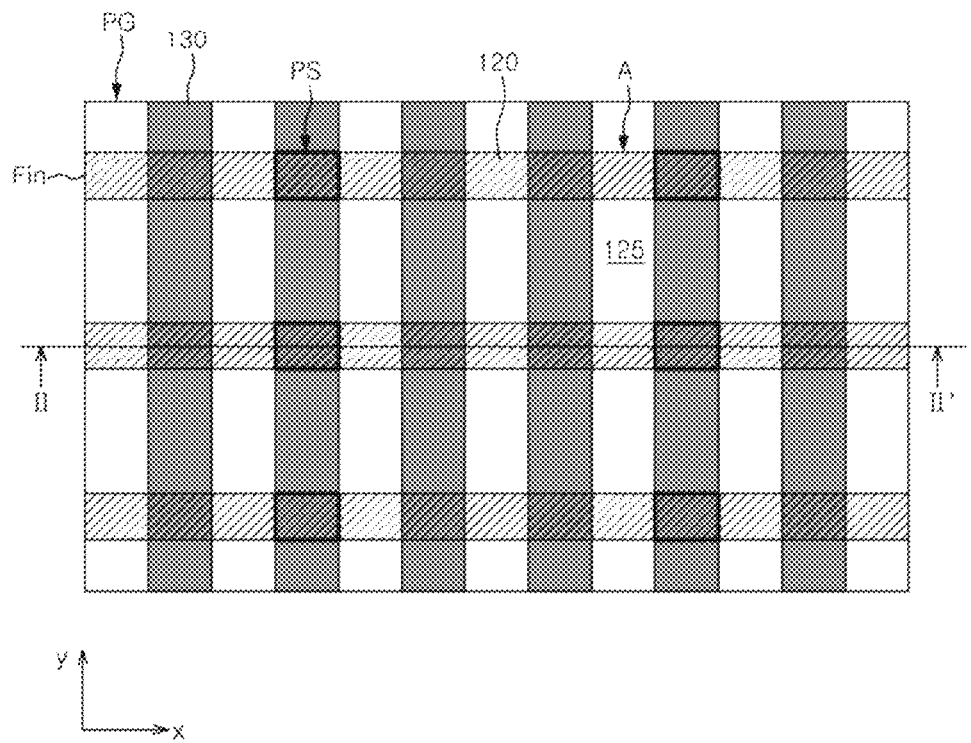
Figure 1C:
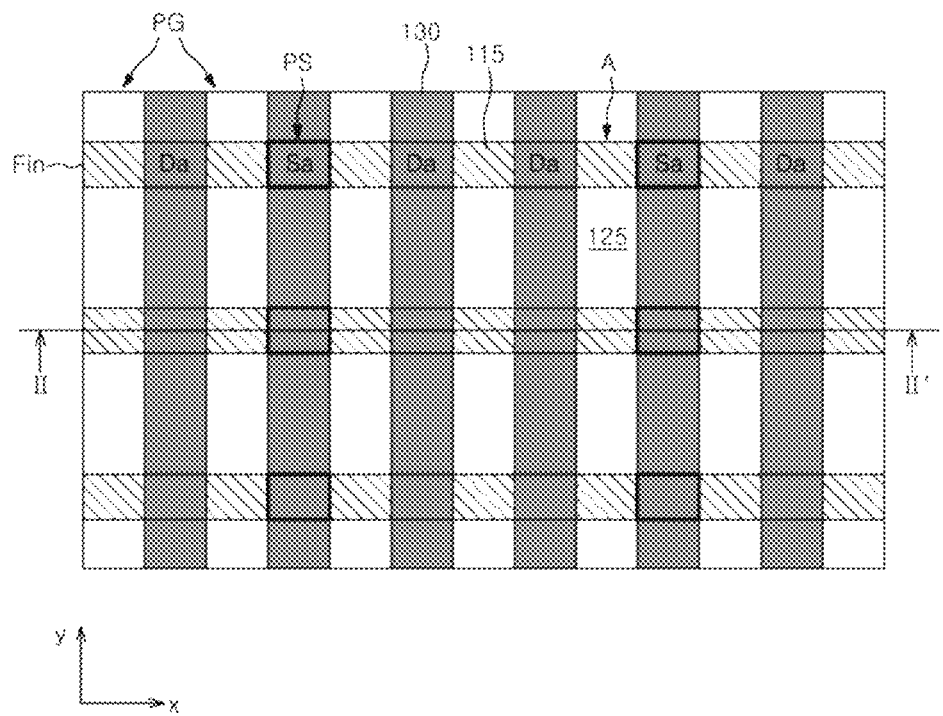
Figure 1D:
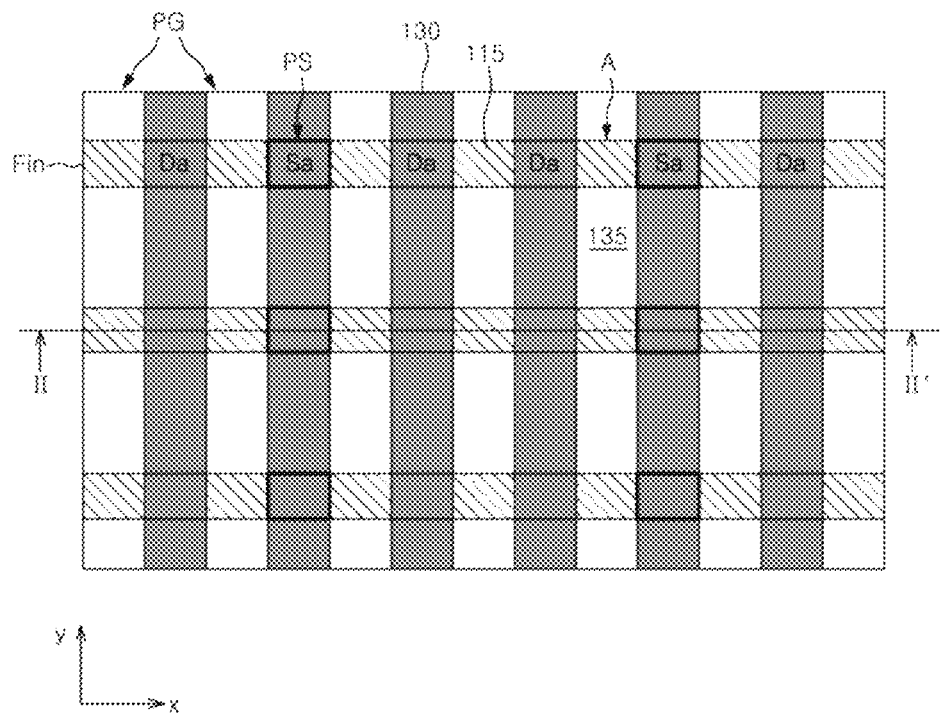
Figure 1E:
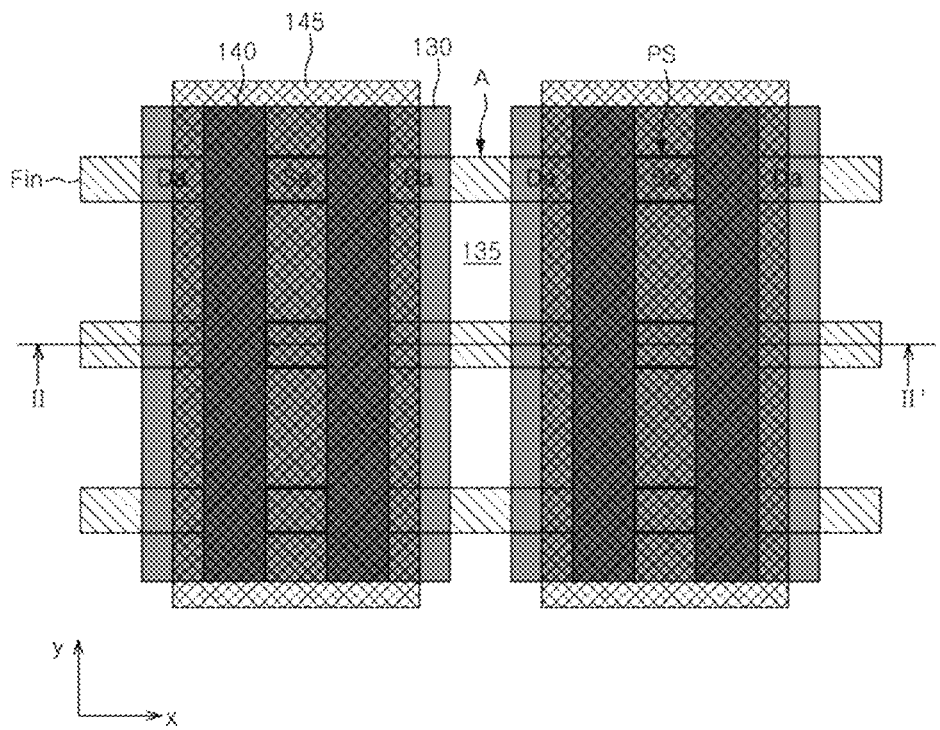
Figure 1F:
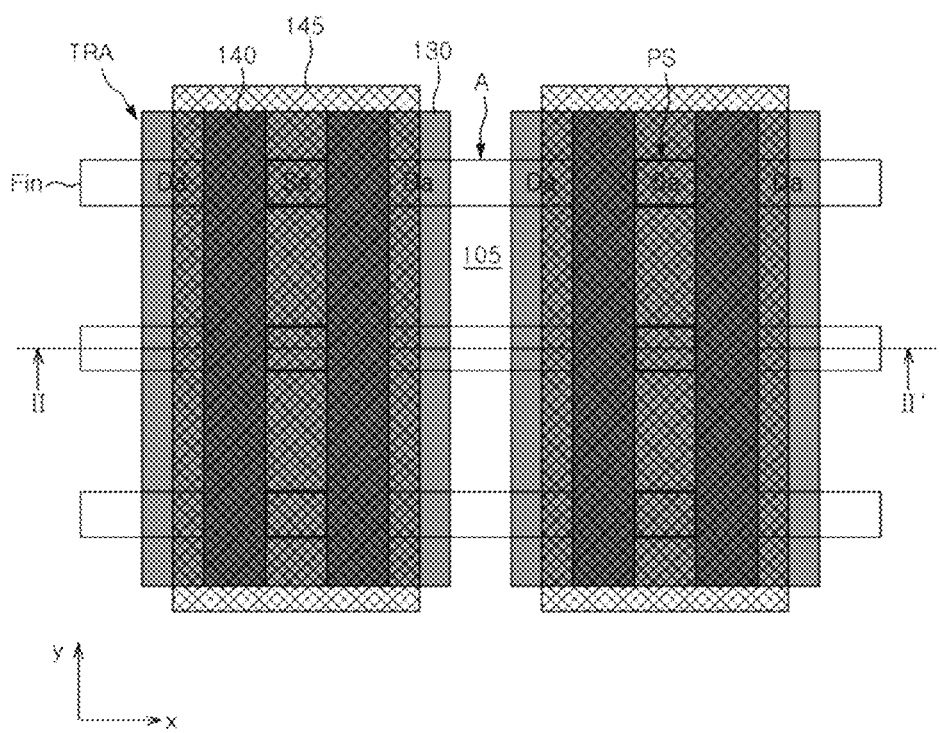
Figure 1G:
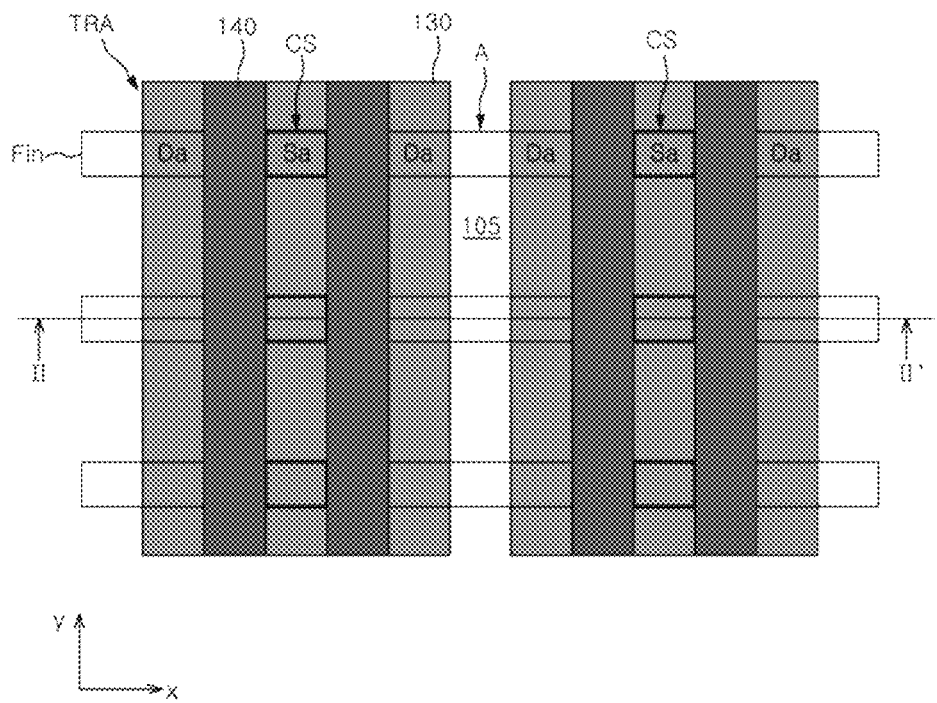
Figure 1H:
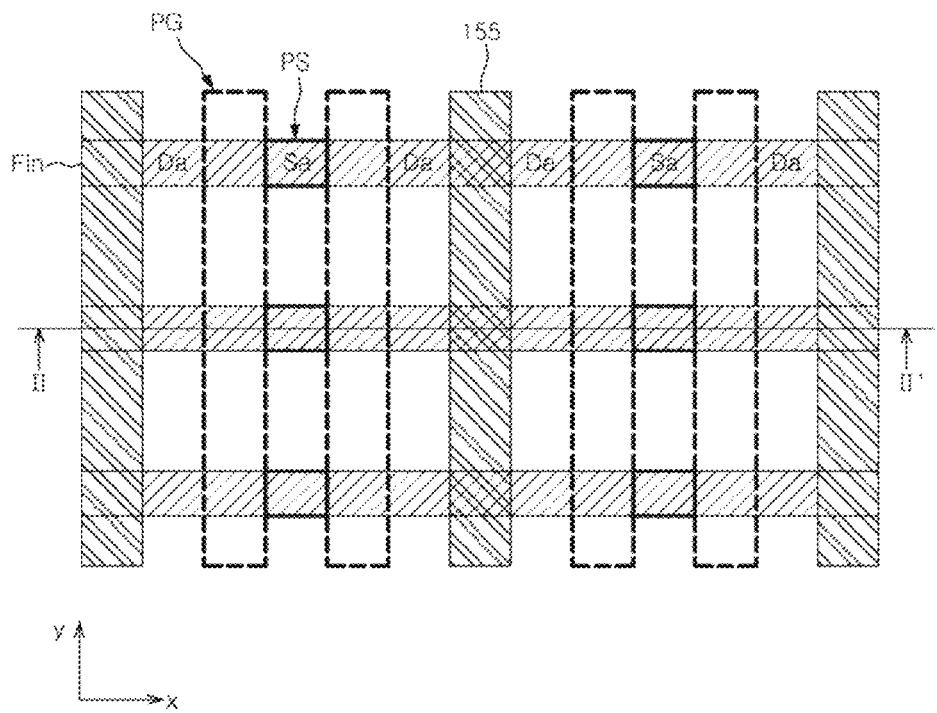
Figure 1I:
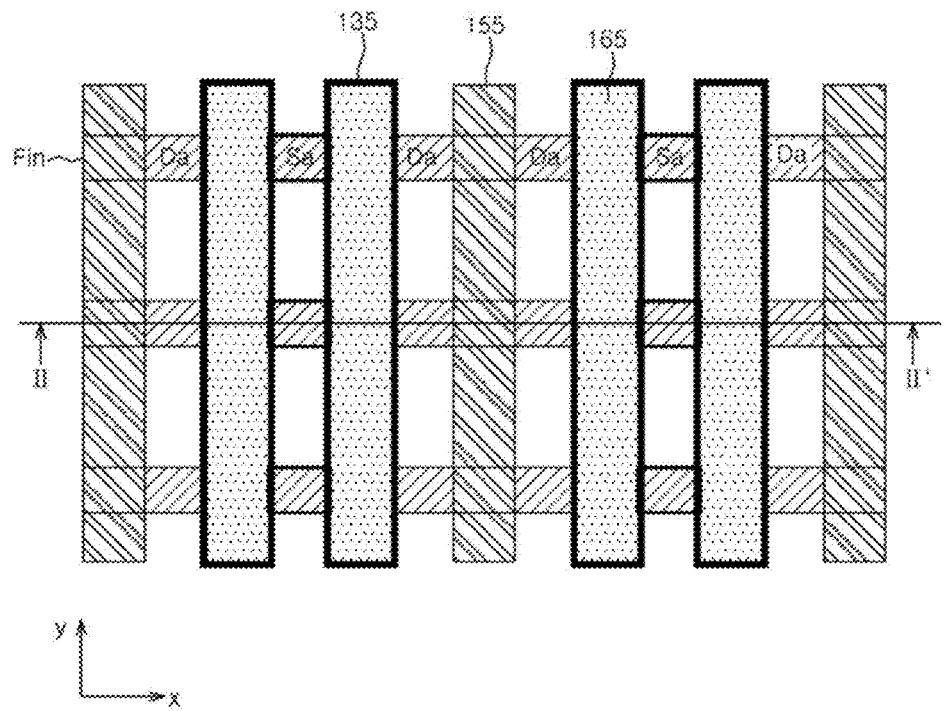
Figure 1J:
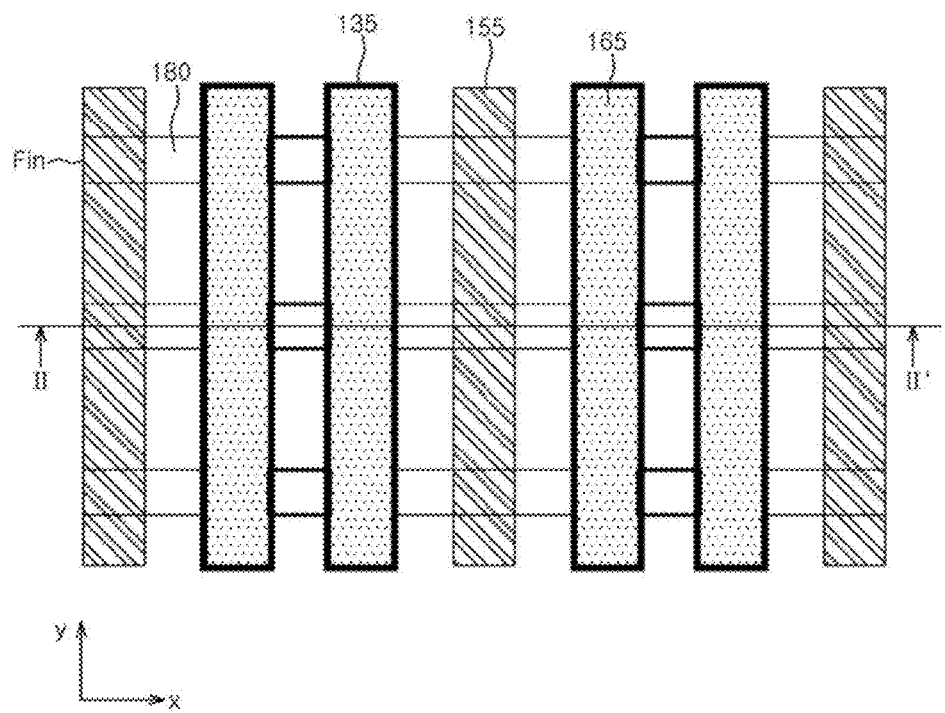
Figure 2A:
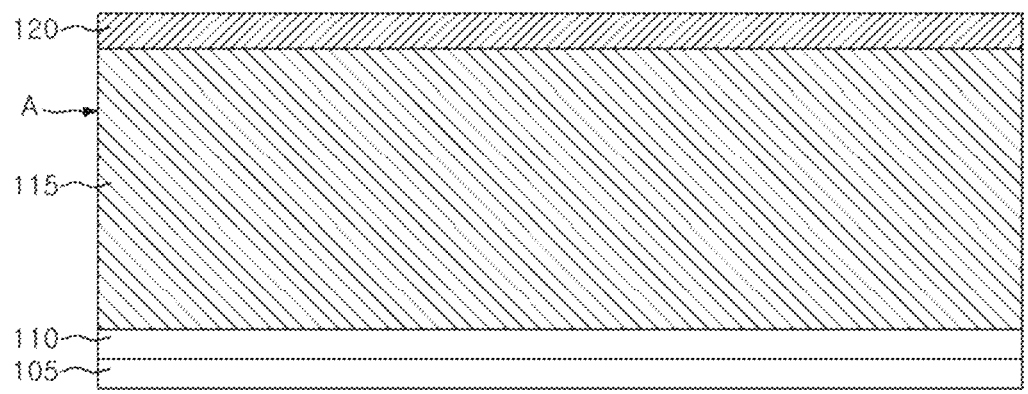
FIGS. 2A to 2J are cross-sectional vie illustrating the method of manufacturing the 3D semiconductor device shown in FIGS. 1A to 1J, taken along lines II-II' of FIGS. 1A to 1J.

Referring to FIGS. 1A and 2A, a first semiconductor layer 110 and a second semiconductor layer 115 may be sequentially formed on a semiconductor substrate 105. The first semiconductor layer 110 and the second semiconductor layer 115 may be formed of materials having different etch selectivities from each other. The first semiconductor layer 110 may be used as a common source node, and may include, for example, a silicon germanium (SiGe) layer. The second semiconductor layer 115 may be used as an active layer, and may include, for example, a silicon (Si) layer. The second semiconductor layer 115 may be formed thicker than the first semiconductor layer 110. The first and second semiconductor layer 110 and 115 may be formed through an epitaxial grown method to have a perfect crystalline state. A hard mask layer 120 may be formed on the semiconductor layer 115. The hard mask layer 120 may include, for example, a silicon nitride to ($Si_3N_4$) layer. A first hard mask pattern (not shown) may be formed on the hard mask layer 120 and the second semiconductor layer 115 and the first semiconductor layer 110 may be patterned in a shape of the first mask pattern to define fin type active regions A. The active regions A may be arranged at a certain interval and extend in an x-direction of FIG. 1A. In FIG. 1A, PG denotes a gate formation region to be formed in a subsequent process, and PS denotes a common source mode formation region. The x-direction in FIG. 1 may correspond to, for example, a bit line extending direction of the resistance variable memory device, and a y-direction may correspond to, for example, a word line extending direction of the resistance variable memory device.

Figure 2B:
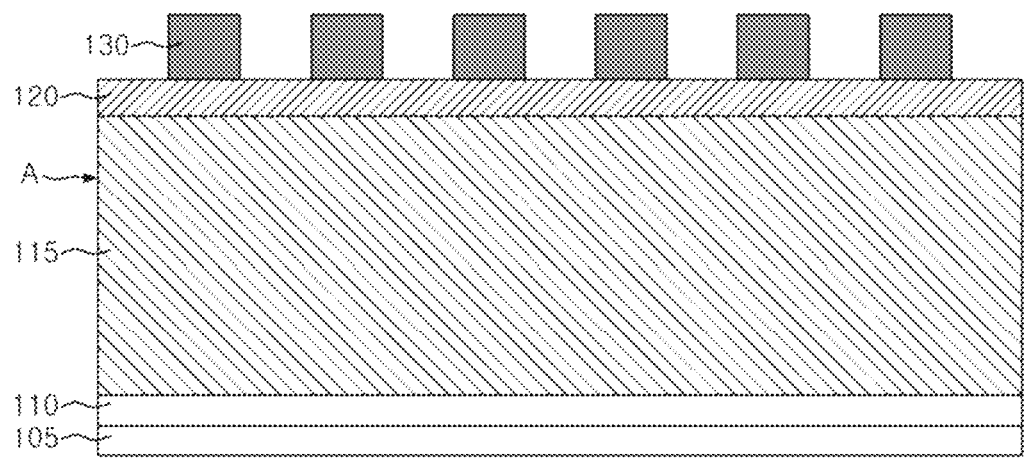

Referring to FIGS. 1B and 2B, a first interlayer insulating layer 125 may be formed on the semiconductor substrate 105 in which the active region A is defined. The first interlayer insulating layer 125 may reduce a step between the fin-type active region A and the semiconductor substrate 105. A second mask pattern 130 for defining a source region and a drain region may be formed on the semiconductor substrate planarized by the first interlayer insulating layer 125. The second mask pattern 130 may be formed of substantially the same as the hard mask pattern 120, and for example, may be formed in a space between the gate formation regions PG. The second mask pattern 130 may extend to a y-direction of FIG. 1B. Since FIG. 2B illustrates a cross-section of a portion in which the active region is formed, the first interlayer insulating layer 125 is not shown.

Figure 2C:
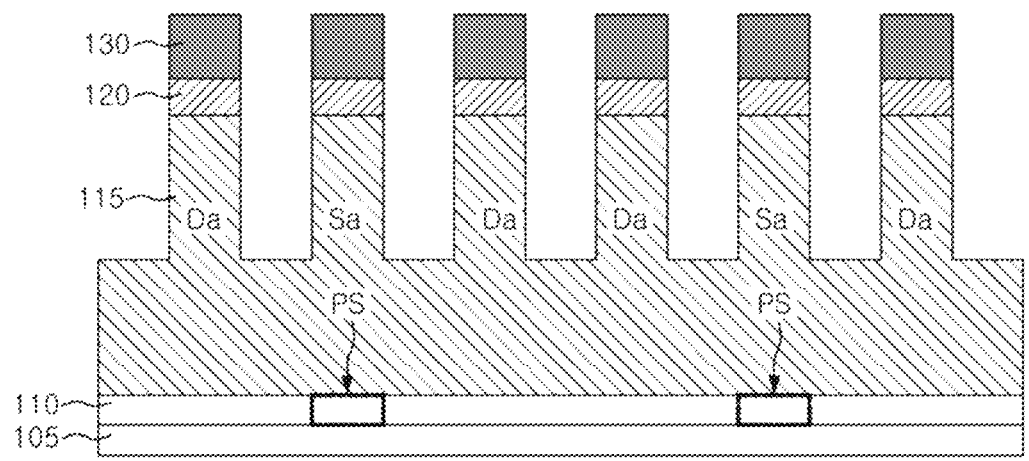

Referring to FIGS. 1C and 2C, a source formation region Sa and a drain formation region Da of a switching transistor are defined by etching the hard mask layer 120 and a portion of the second semiconductor layer 115 in a form of the second mask pattern 130. The source formation region Sa may be formed in a location corresponding to the common source node formation region PS, and the drain formation regions Da may be located at both sides of the source formation region Sa. Thus, one source formation region Sa may be located between a pair of adjacent drain formation regions Da.

Figure 2D:
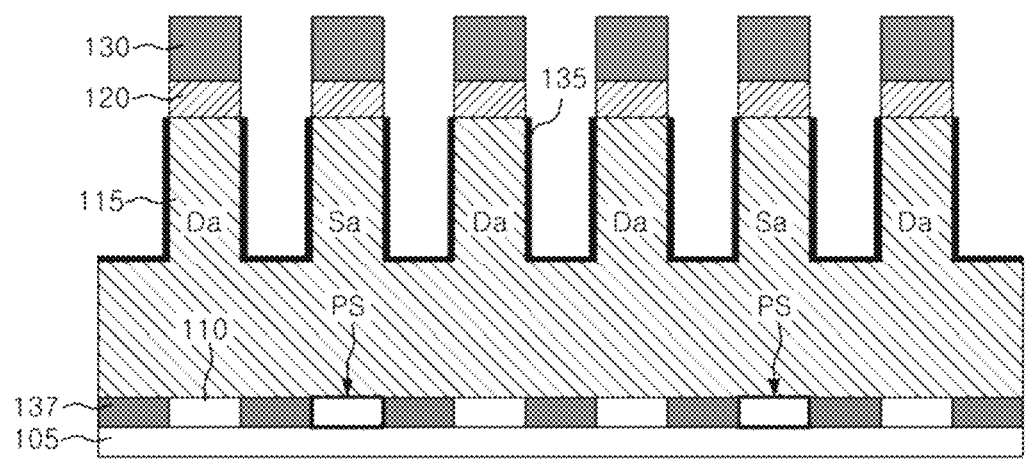

Referring to FIGS. 1D and 2D, a gate insulating layer 135 is formed by oxidizing exposed sidewalls of the source and drain formation regions Sa and Da, that is, an exposed surface of the second semiconductor layer 115. In the process of forming the gate insulating layer 135, the outwardly exposed first semiconductor layer 110 may be also partially oxidized. The reference numeral 137 denotes an oxidized first semiconductor layer (hereinafter, referred to as an oxide semiconductor layer). When the first semiconductor layer 110 may be SiGe, and the second semiconductor layer 115 may be Si, since an oxidation rate of SiGe is greater than that of Si, a total thickness of the exposed first semiconductor layer 110 may be entirely oxidized when the gate insulating layer 135 is formed.

Figure 2E:
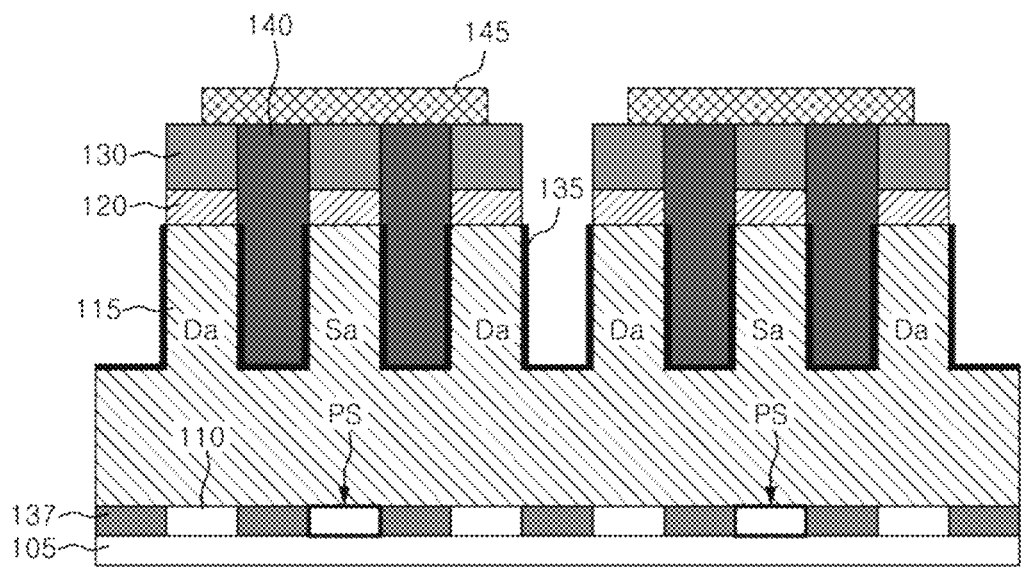

Referring to FIGS. 1E and 2E, a sacrificial gate layer 140 may be buried in the gate formation region PG on which the gate insulating layer 135 is coated. The sacrificial gate layer 140 may include a layer having a different etch selectivity from etching selectivities of the hard to mask layer 120 and the second mask pattern 130. For example, the sacrificial gate layer 140 may include a polysillcon layer, but is not limited thereto. A third mask pattern 145 for defining a transistor region is formed on predetermined portions of the second mask pattern 130 and the sacrificial gate layer 140. The third mask pattern 145 may be formed to shield the common source node formation region PS and the pair of sacrificial gate layers 140 located at the both sides of the common source node formation region PS. That is, since the third mask pattern 145 is formed on a resulting structure in which the second mask pattern 130 is formed, a precise alignment for defining the transistor region may not be necessary. The sacrificial gate layer 140 exposed by the third mask pattern 145 may be selectively removed. The selective removal of the sacrificial gate layer 140 may use a wet etching process.

Figure 2F:
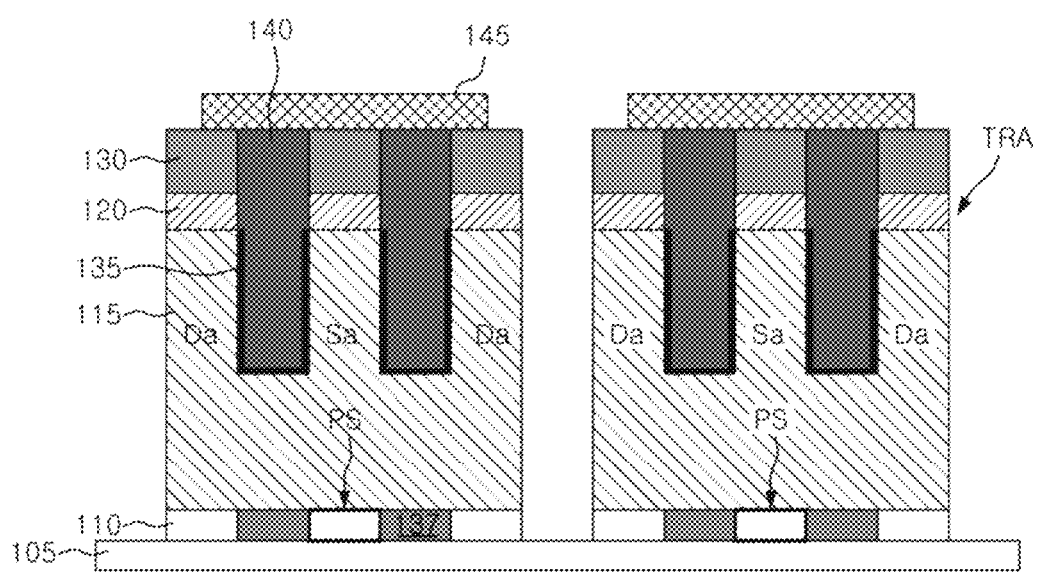

Referring to FIGS. 1F and 2F, the exposed gate insulating layer 135, the second semiconductor layer 115, and the oxide semiconductor layer 137 are etched in forms of the third mask pattern 145 and the second mask pattern 130 to define a unit transistor region TRA.

Figure 2G:
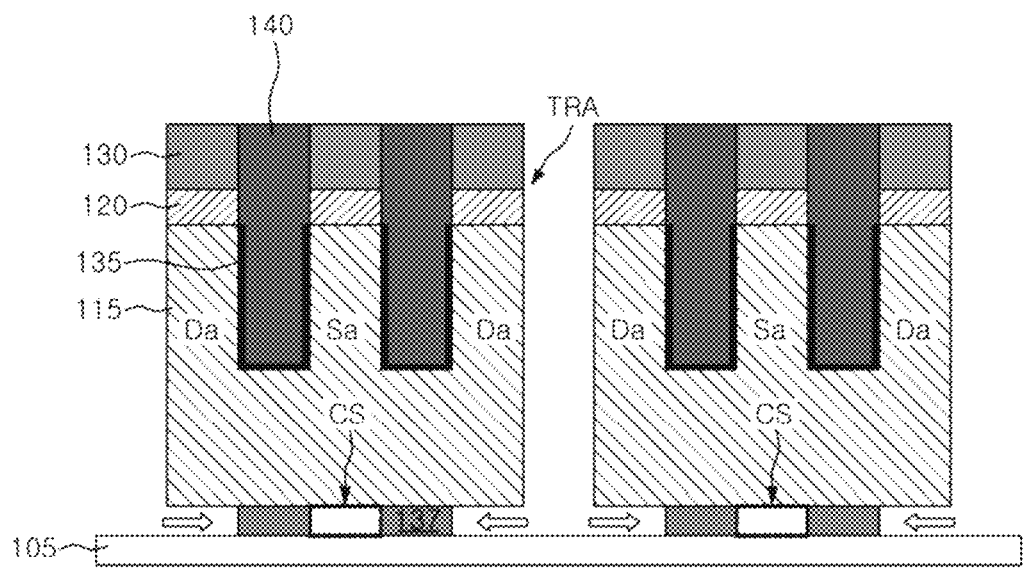

Referring to FIGS. 1G and 2G, the first semiconductor layer 110 exposed through a sidewall of the unit transistor region TRA may be selectively removed. Therefore, the first semiconductor 110 corresponding to the source formation region Sa remains, and thus the remaining first semiconductor layer 110 becomes a common source node CS for electrically coupling the source formation region Sa and a common source (for example, may be formed in the semiconductor substrate). At this time, the common source node CS may be defined in a self-aligned manner by selective oxidation and removal of the first semiconductor layer 110, without a separate mask alignment process.

Figure 2H:
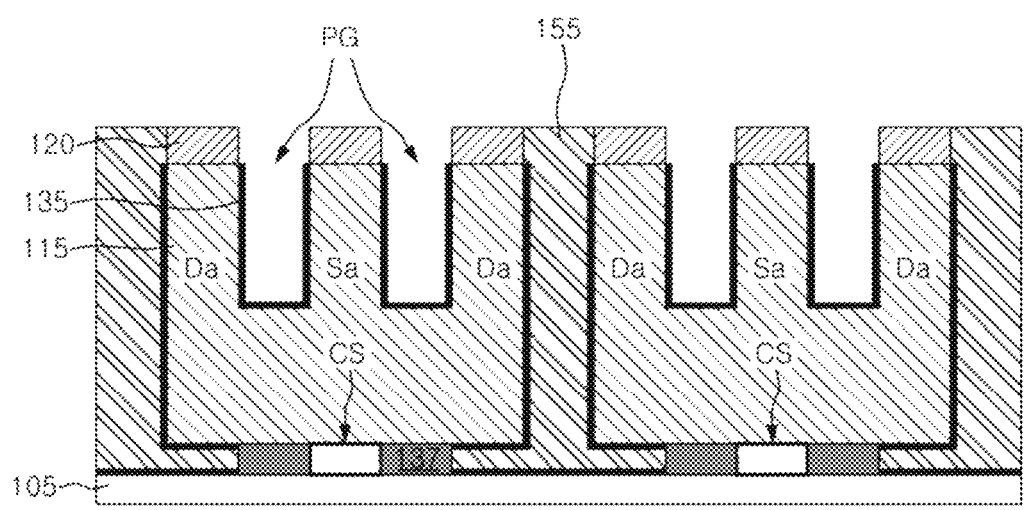

Referring to FIGS. 1H and 2H, a protection layer 150 may be formed on a side surface of the unit transistor region TRA and an exposed surface of the semiconductor substrate 105. The protection layer 150 may be formed by performing oxidation on the semiconductor substrate 105. A gap-fill insulating layer 155 is formed on the semiconductor substrate 105 coated with the protection layer 150. The gap-fill insulating layer 155 may be formed to have a sufficient thickness to be filled in a space between adjacent unit transistor regions TRA. The gap-fill insulating layer 155 may include substantially the same material as the materials of the second mask pattern 130 and the hard mask layer 120. For example, the gap-fill insulating layer 155 may include a silicon nitride layer.

The gap-fill insulating layer 155, the second mask pattern 130, and the sacrificial gate layer 140 may be planarized until a surface of the hard mask layer 120 is exposed. Therefore, complete insulation separation between the adjacent unit transistor regions TRA may be obtained by the gap-fill insulating layer 155.

The exposed sacrificial gate layer 140 may be selectively removed to define a gate formation region PG. The sacrificial gate layer 140 may be selectively etched since the sacrificial gate layer 140 has different etch selectivity from etch selectivities of the gap-fill insulating layer 155 and the second mask pattern 130. Subsequently, the gate formation region PG may be cleaned to remove etch damage due to the removal of the sacrificial gate layer 140. In the cleaning process, the gate insulating layer 135 may be removed, and a new gate insulating layer may be formed again. The gate formation region PG may be defined in a self-aligned manner by the previously formed gap-fill insulating layer 155 and the second mask pattern 130, without a separate mask alignment process.

Figure 2I:
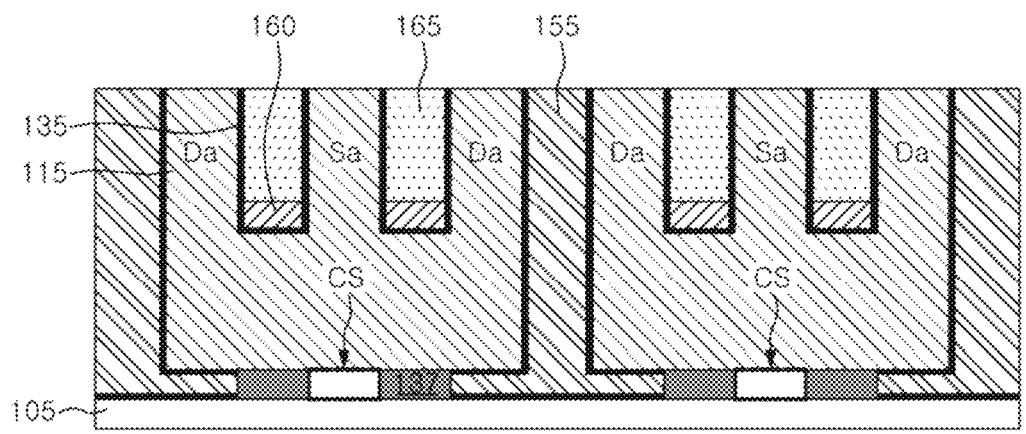

Referring to FIGS. 1I and 2I, a gate 160, that is, a word line is formed in a bottom of the cleaned gate formation region PG. The gate may include a conductive material, for example, one or more materials selected from the group including doped polysilicon, tungsten (W), copper (Cu), titanium nitride (TiN), tantalum nitride (TaN), tungsten nitride (WN), molybdenum nitride (MoN), niobium nitride (NbN), titanium silicon nitride (TiSiN), titanium aluminum nitride (TiAlN) titanium boron nitride (TiBN) zirconium silicon nitride (ZrSIN), tungsten silicon nitride (WSiN), tungsten boron nitride (WBN), zirconium aluminum nitride (ZrAlN), molybdenum silicon nitride (MoSiN), molybdenum aluminum nitride (MoAlN), tantalum silicon nitride (TaSiN), tantalum aluminum nitride (TaAlN), titanium (Ti), molybdenum (Mo), tantalum (Ta), titanium silicide (TiSi), tantalum silicide (TaSi), titanium tungsten (TiW), titanium oxynitride (TiON) titanium aluminum oxynitride (TiAlON), tungsten oxynitride (WON), and tantalum oxynitride (TaON). The gate 160 may be formed by depositing the conductive material to be filled in the gate formation region PG, and leaving the conductive material in the bottom of the gate formation region PG using a recess process such as an etch back process.

Next a gate sealing insulating layer 165 may be formed to be buried in the gate formation region PG on the gate 160. The gate sealing insulating layer 165 may include substantially the same material as that of the gap-fill insulating layer 155, such as a silicon nitride layer. The gate sealing insulating layer 165 may be obtained by depositing the silicon nitride layer to be filled in the gate formation region PG and then performing a planarization process on the silicon nitride layer. In the planarization process of the gate sealing insulating layer 165, the hard mask layer 120 on the source and drain formation regions Sa and Da may be removed.

Figure 2J:
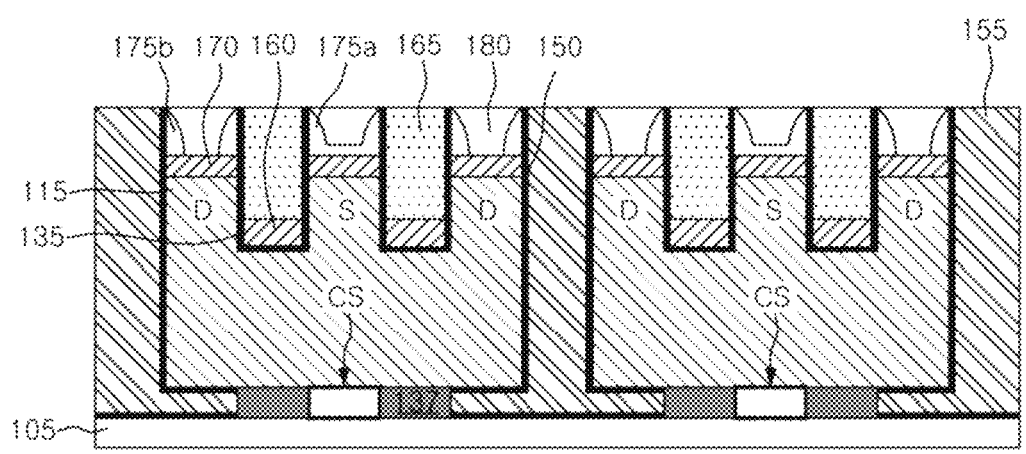

Referring to FIGS. 1J and 2J, the exposed source and drain formation regions Sa and Da may be etched by a predetermined depth using the gap-fill insulating layer 155 and the gate sealing insulating layer 165 as mask patterns, to define variable resistor regions. Impurities are implanted into the source and drain formation regions Sa and Da exposed through the variable resistor regions, to form a source region S and a drain region D.

Heating electrodes 170 may be formed on the variable resistor regions on the source and drain regions S and D. The heating electrodes 170 may be formed by forming a conductive layer to be buried in the variable resistor regions, and by recessing the conductive layer to form the heating electrodes 170 in lower portions of the variable resistor regions.

Insulating layers 175a for spacers may be formed on the source region S and the drain region D in which the heating electrodes 170 are formed. The insulating layer 175a for a spacer may include a silicon nitride layer having a heat-resistance property.

A mask pattern (not shown) may be formed to shield the insulating layer 175a for a spacer on the source region S. The exposed insulating layer 175a for a spacer on the drain region D may be etched using a general spacer etching process, for example, an anisotropic etching process, to form a spacer 175b on a sidewall of the variable resistor region on the drain region D.

The heating electrode 170 on the drain region D may be exposed by the spacer 175b. However, since the insulating layer 175a for a spacer on the source region S is shielded by the mask pattern in the spacer forming process, the insulating layer 175a for a spacer on the source region S is not subject to the spacer etching process. Therefore, the heating electrode 170 of the source region S is covered by the insulating layer 175a for a spacer. Even though the heating electrode 170 is formed on the source region S, since the heating electrode 170 located on the source region S is shielded by the insulating layer 175a for a spacer, the heating electrode 170 may not serve as a substantial heating electrode.

Resistance variable material layers 180 may be formed to be filled in the variable resistor regions. As the resistance variable material layer 180 may include a PCMO layer for a ReRAM, a chalcogenide layer for a PCRAM, a magnetic layer for a MRAM, a magnetization reversal device layer for a spin-transfer torque magnetoresistive RAM (STTMRAM), or a polymer layer for a polymer RAM (PoRAM).

The resistance variable material layer 180 on the drain region D is electrically coupled to the heating electrode 170, and thus a resistance of the resistance variable material layer 180 may be changed according to provision of current and voltage from the heating electrode 170. Since the resistance variable material layer 180 on the source region D is electrically isolated from the heating electrode 170 by the insulating layer 175a for a spacer, the resistance of the resistance variable material layer 180 is not changed.

Subsequently, although not shown, a bit line may be formed on the resistance variable material layer 180. The bit line may be formed in a direction substantially perpendicular to an extending direction of the gate 160.

Therefore, the horizontal channel transistor in which the common source node and the gate are formed in a self-aligned manner may be obtained.

Figure 3:
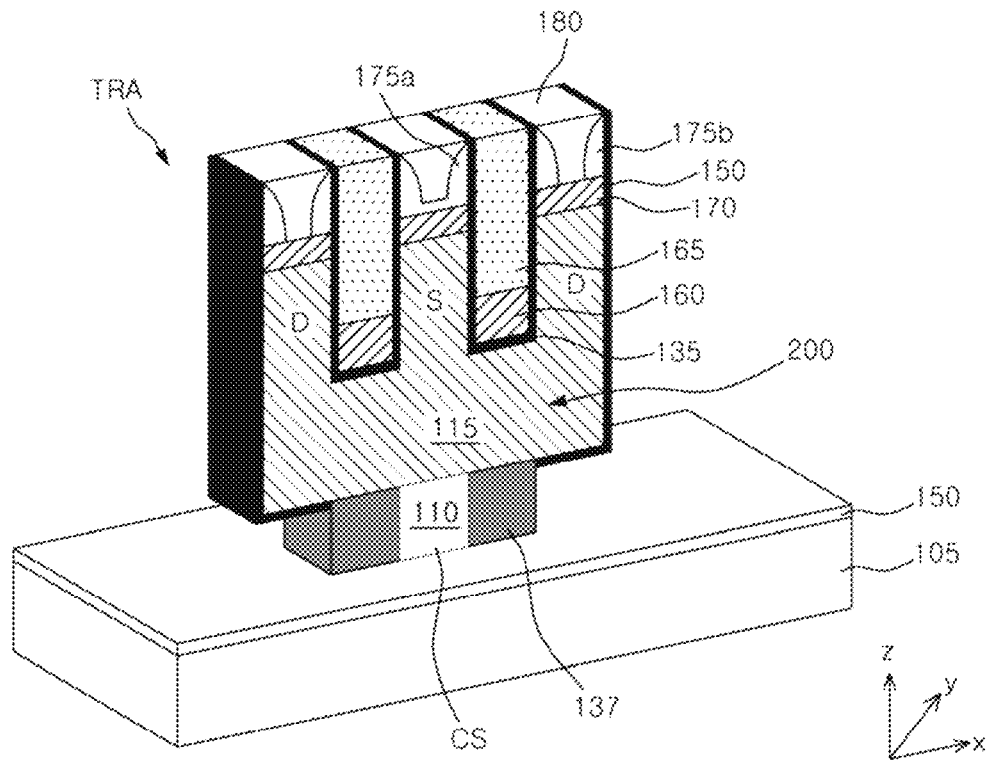

Referring to FIG. 3, a transistor region TRA having a horizontal channel is disposed on a semiconductor substrate 105 with a common source node CS interposed therebetween.

The transistor region TRA having the horizontal channel includes a horizontal channel region 200, and a source region S and a drain region D branched from the horizontal channel region 200 to a z-direction.

The transistor region TRA is formed so that the source region S is located to correspond to the common-source node CS, and the drain regions D are located at both sides of the source region S. Thus, the transistor region TRA has a structure that a pair of drain regions D share one source region S. The source and drain regions S and D are spaced apart from at a certain interval.

A gate 160 may be located in a space between the source region S and drain region D, and a protection layer 150 may be disposed between the source region S and the gate 160 and between the drain region D and the gate 160.

Heating electrodes 170 may be disposed on the source and drain regions S and D, and resistance variable material layers 180 are located on the heating electrodes 170.

At this time, a spacer 175b exposing the heating electrode 170 may be formed on a sidewall of the resistance variable material layer 180 located on the drain region D, and thus the resistance variable material layer 180 may be in direct contact with the heating electrode 170 on the drain region D.

An insulating layer 175a for a spacer may be left in a sidewall and a bottom of the resistance variable material layer 180 located on the source region S, and thus the heating electrode 170 on the source region D and the resistance variable material layer 180 may be electrically disconnected.

Therefore, the resistance variable material layer is electrically coupled to the drain region of the transistor to perform a memory operation.

In the 3D semiconductor device having the above-described structure, the common source node CS suitable for coupling the transistor region TRA having the horizontal channel region 200 and the semiconductor substrate 105, and the gate 160 may be formed in a self-aligned manner, thereby preventing a process error in a complex alignment process.

Further, an aspect ratio of the semiconductor device may be improved using the horizontal channel structure.

An area efficiency may be improved by a configuration in which a pair of drain regions share one source region.

Figure 4:
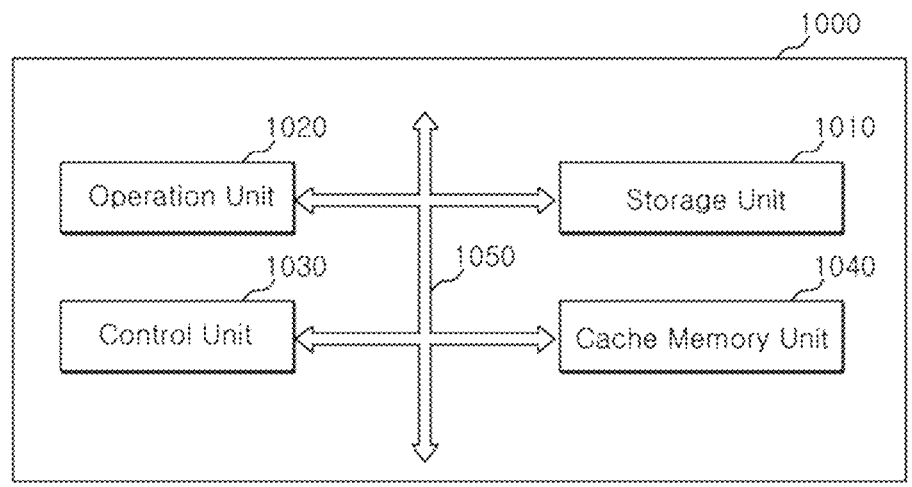

As illustrated in FIG. 4, a microprocessor 1000 to which the semiconductor device according to the embodiment is applied may control and adjust a series of processes, which receive data from various external apparatuses, process the data and transmit processing results to the external apparatuses. The microprocessor 1000 may include a storage unit 1010, an operation unit 1020, and a control unit 1030. The microprocessor 1000 may be a variety of processing apparatuses, such as a central processing unit (CPU), a graphic processing unit (GPU), a digital signal processor (DSP), or an application processor (AP).

The storage unit 1010 may be a processor register or a register, and the storage unit may be a unit that may store data in the microprocessor 1000 and include a data register, an address register, and a floating point register. The storage unit 1010 may include various registers other than the above-described registers. The storage unit 1010 may temporarily store data to be operated in the operation unit 1020, resulting data performed in the operation unit 1020, and an address in which data to be operated is stored.

The storage unit 1010 may include one of the semiconductor devices according to embodiments. The storage unit 1010 including the semiconductor device according to the above-described embodiment may include a semiconductor device including a vertical channel structure in which a gate and a common source are formed in a self-aligned manner. The detailed configuration of the semiconductor device may be the same as the structure of FIG. 3.

The operation unit 1020 may perform an operation in the microprocessor 1000, and perform a variety of four fundamental rules of an arithmetic operation or a logic operation depending on a decryption result of a command in the control unit 1030. The operation unit 1020 may include one or more arithmetic and logic units (ALU).

The control unit 1030 receives a signal from the storage unit 1010, the operation unit 1020, or an external apparatus of the microprocessor 1000, performs extraction or decryption of a command, or input or output control, and executes a process in a program form.

The microprocessor 1000 according to the embodiment may further include a cache memory unit 1040 suitable for temporarily storing data input from an external apparatus other than the storage unit 1010 or data to be output to an external apparatus. At this time, the cache memory unit 1040 may exchange data from the storage unit 1010, the operation unit 1020, and the control unit 1030 through a bus interface 1050.

Figure 5:
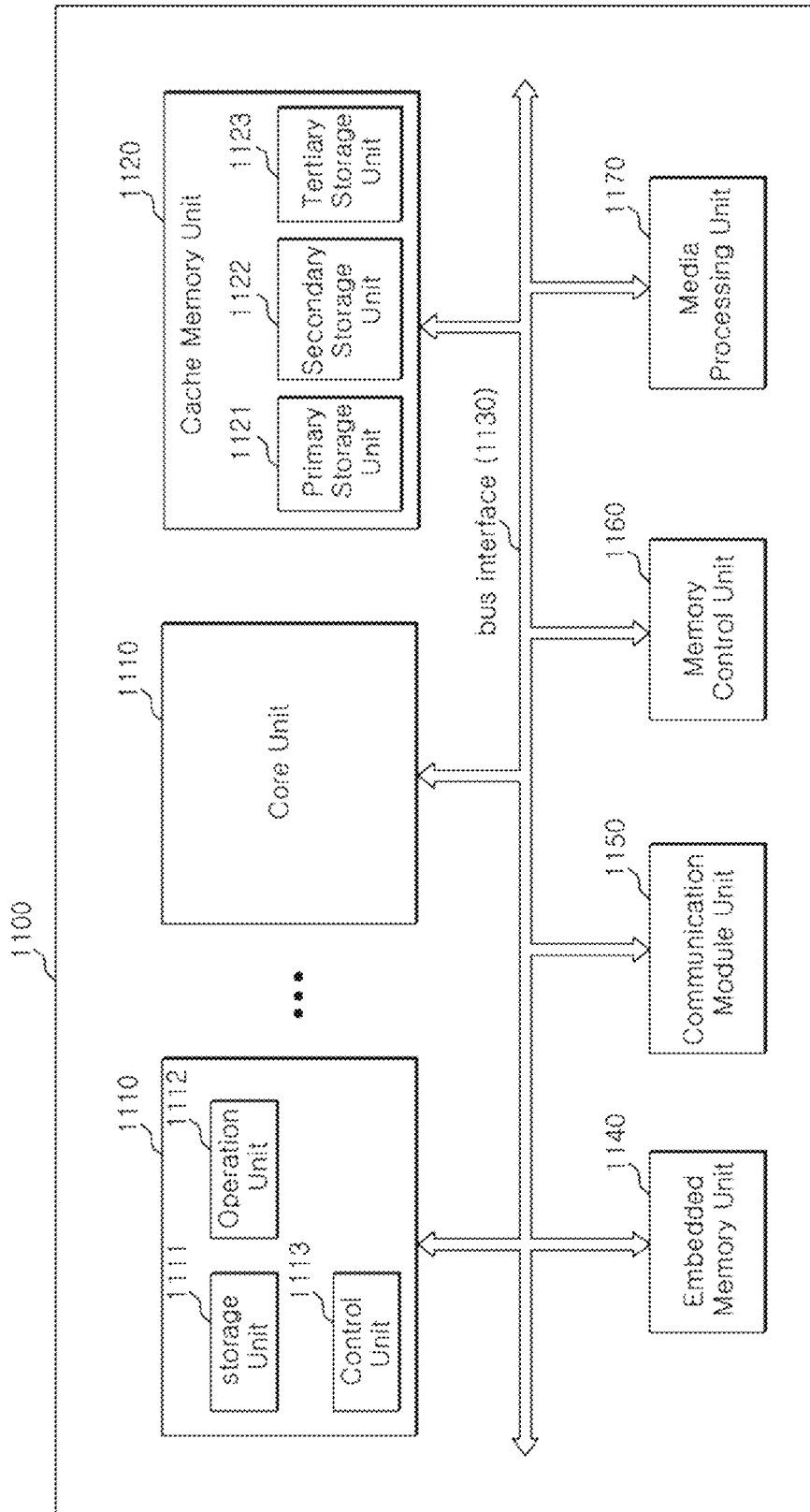

As illustrated in FIG. 5, a processor 1100 according to the embodiment may include various functions to implement performance improvement and multifunction other than the functions of the microprocessor that may control and adjust a series of processes, which receive data from various external apparatuses, process the data and transmit processing results to the external apparatuses. The processor 1100 may include a core unit 1110, a cache memory unit 1120, and a bus interface 1130. The core unit 1110 in the embodiment is a unit may perform arithmetic and logic operations on data input from an external apparatus, and include a storage unit 1111, an operation unit 1112, and a control unit 1113. The processor 1100 may be a variety of system on chips (SoCs) such as a multi core processor (MCP), a GPU, and an AP.

The storage unit 1111 may be a processor register or a register, and the storage unit 1111 may be a unit may store data in the processor 1000 and include a data register, an address register, and a floating point register. The storage unit 1111 may include various registers other than the above-described registers. The storage unit 1111 may temporarily store data to be operated in the operation unit 1112, resulting data performed in the operation unit 1112 and an address in which data to be operated is stored. The operation unit 1112 may be a unit that may perform an operation in the inside of the processor 1100, and perform a variety of four fundamental rules of an arithmetic operation or a logic operation depending on a decryption result of a command in the control unit 1113. The operation unit 1112 may include one or more arithmetic and logic unit (ALU). The control unit 1113 receives a signal from the storage unit 1111, the operation unit 1112, and an external apparatus of the processor 1100, performs extraction or decryption of a command, or input or output control, and executes a process in a program form.

The cache memory unit 1120 may be temporarily store data to supplement a data processing rate of a low speed external apparatus unlike the high speed core unit 1110. The cache memory unit 1120 may include a primary storage unit 1121, a secondary storage unit 1122, and a tertiary storage unit 1123. In general, the cache memory unit 1120 may include the primary and secondary storage units 1121 and 1122. When a high capacity storage unit is necessary, the cache memory unit 1120 may include the tertiary storage unit 1123. If necessary, the cache memory 1120 may include more storage units. That is, the number of storage units included in the cache memory unit 1120 may be changed according to design. Here, processing rates of data storage and discrimination of the primary, secondary, and tertiary storage units 1121, 1122, and 1123 may be the same or different. When the processing rates of the storage units are different, the processing rate of the primary storage unit is the greatest. One or more of the primary storage unit 1121, the secondary storage unit 1122, and the tertiary storage unit 1123 in the cache memory unit may include one of the semiconductor devices according to embodiments. The cache memory unit 1120 including the semiconductor device according to the above-described embodiment may include a semiconductor device including a vertical channel structure in which a gate and a common source are formed in a self-aligned manner. The detailed configuration of the semiconductor device may be the same as the structure of FIG. 3.

FIG. 5 has illustrated that all the primary, secondary, tertiary storage units 1121, 1122, and 1123 are formed in the cache memory unit 1120. However, all the primary, secondary, tertiary storage units 1121, 1122, and 1123 may be formed in the outside of the cache memory unit 1120, and may supplement a difference between the processing rate of the core unit 1110 and an external apparatus. Further, the primary storage unit 1121 of the cache memory unit 1120 may be located in the core unit 1110, and the secondary storage unit 1122 and the tertiary storage unit 1123 may be formed in the outside of the core unit 1110 to enforce a function to compensate a processing rate.

The bus interface 1130 is a unit that may couple the core unit 1110 and the cache memory unit 1120 to efficiently transmit data.

The processor unit 1100 according to the embodiment may include a plurality of core units 1110, and the core units 1110 may share a cache memory unit 1120. The core units 1110 and the cache memory unit 1120 may be coupled through the bus interface 1130. The core units 1110 may have the same configuration as the configuration of the above-described core unit 1110. When the core units 1110 are provided, the primary storage unit 1121 of the cache memory unit 1120 may be formed in each of the core units 1110 corresponding to the number of core units 1110, and the secondary storage unit 1122 and the tertiary storage unit 1123 may be formed in one body in the outsides of the core units 1110 to be shared through the bus interface 1130 Here, the processing rate of the primary storage unit 1121 may be larger than those of the secondary and tertiary storage units 1122 and 1123.

The processor 1100 according to the embodiment may further include an embedded memory unit 1140 that may store data, a communication module unit 1150 that may transmit and receive data from an external apparatus in a wired manner or a wireless manner, a memory control unit 1160 that may drive an external storage device, a media processing unit 1170 that may process data processed in the processor 1100 or data input from an external apparatus and outputting a processing result to an external interface device, and a plurality of modules. At this time, the modules may transmit data to and receive data from the core unit 1110 and the cache memory unit 1120, and transmit and receive data between the modules, through the bus interface 1130.

The embedded memory unit 1140 may include a volatile memory or a nonvolatile memory. The volatile memory may include a dynamic random access memory (DRAM), a mobile DRAM, a static random access memory (SRAM) and the like, and the nonvolatile memory may include a read only memory (ROM) a NOR flash memory, a NAND flash memory, a phase-change random access memory (PRAM), a resistive RAM (RRAM) a spin transfer torque RAM (STTRAM), a magnetic RAM (MRAM), and the like. The semiconductor device according to the embodiment may be applied to the embedded memory unit 1140.

The communication module unit 1150 may include all modules such as a module coupled to a wired network and a module coupled to a wireless network. The wired network module may include a local area network (LAN), a universal serial bus (USB), Ethernet, a power line communication (PLC), and the like, and the wireless network module may include Infrared Data Association (IrDA), Code Division Multiple Access (CDMA), Time Division Multiple Access (TDMA), Frequency Division Multiple Access (FDMA), a wireless LAN, Zigbee, a Ubiquitous Sensor Network (USN), Bluetooth, Radio Frequency Identification (RFID), Long Term Evolution (LTE), Near Field Communication (NFC), Wireless Broadband Internet (Wibro), High Speed Downlink Packet Access (HSDPA), Wideband CDMA (WCDMA), Ultra WideBand (UWB), and the like.

The memory control unit 1160 may be a unit that may manage data transmitted between the processor 1100 and an external apparatus that may operate according to a different communication standard from the processor 1100. The memory control unit 1160 may include a variety of memory controllers, or a controller that may control Integrated Device Electronics (IDE), Serial Advanced Technology Attachment (SATA), a Small Computer System Interface (SCSI), a Redundant Array of Independent Disks (RAID), a solid state disk (SSD), External SATA (eSATA), Personal Computer Memory Card International Association (PCMCIA), a USB, a secure digital (SD) card, a mini secure digital (mSD) card, a micro SD card, a secure digital high capacity (SDHC) card, a memory stick card, a smart media card (SM), a multi media card (MMC), an embedded MMC eMMC), a compact flash (CF) card, or the like.

The media processing unit 1170 may be a unit that may process data processed in the processor 1100 or data input from an external input device and outputting a processing result to an external interface device so that the processing result may be transferred in video, a voice, and other types.

The media processing unit 1170 may include a GPU, a DSP, a HD audio, a high definition multimedia interface (HDMI) controller, or the like.

Figure 6:
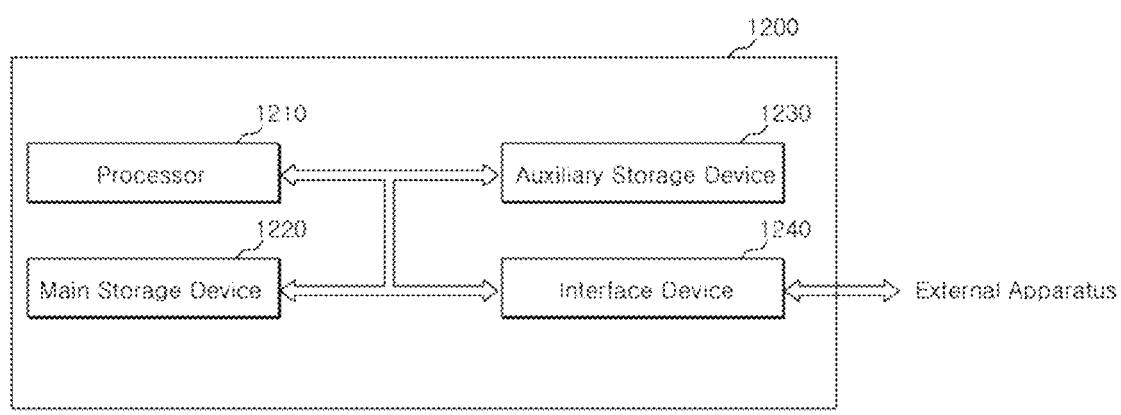

As illustrated in FIG. 6, a system 1200 to which the semiconductor device according to an embodiment of the inventive concept is applied is a data processing apparatus. The system 1200 may perform input, processing, output, communication, storage, and the like to perform a series of operations on data, and include a processor 1210, a main storage device 1220, an auxiliary storage device 1230, and an interface device 1240. The system according to the embodiment may be a variety of electronic systems that may operate by using a processor, such as a computer, a server, a personal digital assistant (PDA), a portable computer, a web tablet, a wireless phone, a mobile phone, a smart phone, a digital music player, a portable multimedia player (PMP), a camera, a global positioning system (GPS), a video camera, a voice recorder, Telematics, an audio visual (AV) system, or a smart television.

The processor 1210 is a core configuration of the system that may control interpretation of an input command and processing an operation, comparison, and the like of data stored in the system, and may be formed of a MPU, a CPU, a single/multi core processor, a GPU, an AP, a DSP, or the like.

The main storage unit 1220 is a storage place that may receive a program or data from the auxiliary storage device 1230 and execute the program or the data. The main storage device 1220 retains the stored content even in power off, and may include the semiconductor device according to the above-described embodiment. The main storage device 1220 may use a semiconductor device including a vertical channel structure in which a gate and a common source are formed in a self-aligned manner. The detailed configuration of the semiconductor device may be the same as the structure of FIG. 3.

The main storage device 1220 according to the embodiment may further include an SRAM or a DRAM of a volatile memory type in which all contents are erased in power off. Alternatively, the main storage device 1220 may not include the semiconductor device according to the embodiment but may include an SRAM or a DRAM of a to volatile memory type in which all contents are erased in power off.

The auxiliary storage device 1230 is a storage device that may store a program code or a data. The auxiliary storage device 1230 may have a lower data processing rate than that of the main storage device 1220, but may store a large amount of data and include the semiconductor device according to the above-described embodiment. The auxiliary storage unit 1230 may also use a semiconductor device including a vertical channel structure in which a gate and a common source are formed in a self-aligned manner. The detailed configuration of the semiconductor device may be the same as the structure of FIG. 3.

An area of the auxiliary storage device 1230 according to the embodiment may be decreased, to reduce a size of the system 1200 and increase portability of the system 1200. Further, the auxiliary storage device 1230 may further include a data storage system, such as a magnetic tape and a magnetic disc using a magnetism, a laser disc using light, a magneto-optical disc using a magnetism and light, an SSD, a USB memory, a SD card, a mSD card, a micro SD card, a SDHC card, a memory stick card, a smart media card, a MMC card, an eMMC, or a CF card. Unlike this, the auxiliary storage device 1230 may not include the semiconductor device according to the above-described embodiment but may include a data storage system, such as a magnetic tape and a magnetic disc using a magnetism, a laser disc using light, a magneto-optical disc using a magnetism and light, an SSD, a USB memory, a SD card, a mSD card, a micro SD card, a SDHC card, a memory stick card, a smart media card, a MMC card, an eMMC, or a CF card.

The interface device 1240 may exchange a command and data of an external apparatus with the system of the embodiment, and may be a keypad, a keyboard, a mouse, a speaker, a mike, a display, a variety of Human Interface Devices (HIDs), or a communication device. The communication device may include all modules such as a module coupled to a wired network or a module coupled to a wireless network. The wired network module may include a LAN, a USB, Ethernet, a power line communication (PLC), or the like, and the wireless network module may include Infrared Data Association (IrDA), Code Division Multiple Access (CDMA), Time Division Multiple Access (TDMA), Frequency Division Multiple Access (FDMA), a wireless LAN, Zigbee, a Ubiquitous Sensor Network (USN), Bluetooth, Radio Frequency Identification (RFID), Long Term Evolution (LTE), Near Field Communication (NFC), Wireless Broadband Internet (Wibro), High Speed Downlink Packet Access (HSDPA), Wideband CDMA CDMA), Ultra Wide-Band (UWB), or the like.

As specifically described above, the memory device according to the embodiment may form a gate and a common source in a self-aligned manner to reduce a complex alignment process and prevent a process defect.

The above embodiment of the present invention is illustrative and not limitative. Various alternatives and equivalents are possible. The invention is not limited by the embodiment described herein. Nor is the invention limited to any specific type of semiconductor device. Other additions, subtractions, or modifications are obvious in view of the present disclosure and are intended to fall within the scope of the appended claims.

What is claimed is:

1. A semiconductor device, comprising:
   a semiconductor substrate;
   a common source node formed on the semiconductor substrate;
   a transistor region including a horizontal channel region formed on the common source node and substantially parallel to a surface of the semiconductor substrate, and source and drain regions branched from the horizontal channel region to a direction substantially perpendicular to the surface of the semiconductor substrate;
   a gate formed in a space between the source region and the drain region;
   heating electrodes formed on the source region and the drain region; and
   resistance variable material layers formed on the heating electrodes,
   wherein a resistance variable material layer on the drain region is electrically coupled to a heating electrode thereunder, and a resistance variable material layer on the source region is electrically disconnected to a heating electrode thereunder.

2. The semiconductor device of claim 1, wherein the common source node is formed to have a pattern shape with a predetermined height.

3. The semiconductor device of claim 1, wherein the common source node includes a semiconductor layer having different etch selectivity to the transistor region.

4. The semiconductor device of claim 3, wherein the common source node includes a silicon germanium layer and the transistor region includes a silicon layer.

5. The semiconductor device of claim 1, wherein the source region is formed to correspond to the common source.

6. The semiconductor device of claim 5, wherein the drain regions are formed at the sides of the source region.

7. The semiconductor device of claim 1, wherein the transistor region includes one source region and two drain regions.

8. The semiconductor device of claim 1, wherein the gate includes a height which is shallower than the heights of the source and drain regions.

9. The semiconductor device of claim 1, wherein a resistance variable material layer on the drain region is electrically coupled to a heating electrode thereunder, and a resistance variable material layer on the source region is electrically disconnected to a heating electrode thereunder.

10. The semiconductor device of claim 9, further comprising a space layer formed between the heating electrode on the source region and the resistance variable material layer on the source region.

11. The semiconductor device of claim 9, further comprising a gate sealing insulating layer on the gate.

* * * * *